United States Patent
Whitehouse et al.

(10) Patent No.: US 10,511,157 B2
(45) Date of Patent: Dec. 17, 2019

(54) ARC DETECTION IN ELECTRIC METER SYSTEMS

(71) Applicant: Landis+Gyr Innovations, Inc., Alpharetta, GA (US)

(72) Inventors: Thomas Clyde Whitehouse, Bethlehem, GA (US); James Stortz, Roswell, GA (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 185 days.

(21) Appl. No.: 15/688,176

(22) Filed: Aug. 28, 2017

(65) Prior Publication Data
US 2018/0062373 A1 Mar. 1, 2018

Related U.S. Application Data

(60) Provisional application No. 62/380,735, filed on Aug. 29, 2016.

(51) Int. Cl.
| | |
|---|---|
| *H02H 1/00* | (2006.01) |
| *G01R 19/25* | (2006.01) |
| *G01R 31/02* | (2006.01) |
| *G01R 31/327* | (2006.01) |
| *G01R 35/02* | (2006.01) |

(Continued)

(52) U.S. Cl.
CPC ....... *H02H 1/0023* (2013.01); *G01R 19/2513* (2013.01); *G01R 31/024* (2013.01); *G01R 31/045* (2013.01); *G01R 31/3275* (2013.01); *G01R 35/02* (2013.01); *H01H 73/18* (2013.01); *H02H 1/046* (2013.01); *G01R 22/063* (2013.01);

(Continued)

(58) Field of Classification Search
CPC .. H02H 1/0023; H02H 1/046; G01R 31/3275; G01R 31/045; G01R 19/2513; G01R 35/02; G01R 31/024; G01R 22/068; G01R 31/025; G01R 22/063; G01R 31/1227; H01H 73/18
See application file for complete search history.

(56) References Cited

U.S. PATENT DOCUMENTS

| | | |
|---|---|---|
| 6,110,540 A | 8/2000 | Countrywood et al. |
| 8,503,137 B2 | 8/2013 | Panetta |

(Continued)

FOREIGN PATENT DOCUMENTS

| | | |
|---|---|---|
| WO | 2018044847 | 3/2018 |

OTHER PUBLICATIONS

Product Specification Sheet, Landis+Gyr Remote Service Switch, 2009 (Year: 2009).*

(Continued)

*Primary Examiner* — Daniel R Miller
(74) *Attorney, Agent, or Firm* — Kilpatrick Townsend & Stockton LLP (57) ABSTRACT

An electrical metering system in a utility box is capable of receiving electrical signals received from a power utility company. The electrical metering system includes measurement circuitry capable of measuring properties of the received electrical signals. Based on the measurements, a determination is made that an arcing condition is present in the utility box. Based on the determination that the arcing condition is present, a disconnect circuit is activated to interrupt the connection between a source of the electrical signals and a premises.

20 Claims, 6 Drawing Sheets

(51) Int. Cl.
*H01H 73/18* (2006.01)
*H02H 1/04* (2006.01)
*G01R 31/04* (2006.01)
*G01R 22/06* (2006.01)
*G01R 31/12* (2006.01)

(52) U.S. Cl.
CPC .......... *G01R 22/068* (2013.01); *G01R 31/025* (2013.01); *G01R 31/1227* (2013.01)

(56) References Cited

U.S. PATENT DOCUMENTS

| | | | | |
|---|---|---|---|---|
| 2007/0057678 | A1* | 3/2007 | Dvorak | G01R 31/024 324/536 |
| 2011/0174780 | A1* | 7/2011 | Nitert | H02B 13/01 218/139 |
| 2012/0275071 | A1* | 11/2012 | Gutierrez | H02H 1/0015 361/42 |
| 2012/0299745 | A1* | 11/2012 | LaFrance | G01D 4/004 340/870.02 |
| 2013/0057408 | A1 | 3/2013 | Aiken | |
| 2014/0327449 | A1 | 11/2014 | Shuey et al. | |
| 2015/0247900 | A1* | 9/2015 | Shuey | G01R 22/065 324/415 |

OTHER PUBLICATIONS

Landis+Gyr Announces Release of Command Center 6.2, 2014 (Year: 2014).*

Koziy et al., "Low-Cost Power-Quality Meter With Series Arc-Fault Detection Capability for Smart Grid", IEEE, Transactions on the Power Delivery, IEEE Service Center, vol. 28, No. 3, Jul. 3, 2013, pp. 1584-1591.

PCT/US2017/049036 , "International Search Report and Written Opinion", dated Nov. 10, 2017, 12 pages.

* cited by examiner

ARC DETECTION IN ELECTRIC METER SYSTEMS

RELATED APPLICATIONS

The present application claims priority to U.S. provisional application No. 62/380,735 for "Arc detection in electric meter systems" filed Aug. 29, 2016, which is incorporated by reference herein in its entirety.

FIELD OF THE INVENTION

This disclosure relates generally to the field of safety in electrical utility systems, and more specifically relates to preventing or interrupting electrical arcs between electrical metering components included in a utility box at a premises.

BACKGROUND

Many residential and commercial premises include electric meter systems to allow utility companies to monitor the consumption of electricity within the premises. An electric meter may include a metering component to measure the consumption and a radio component to communicate the measurements to the utility company for billing and other purposes. The meter is electrically connected to a socket, which is usually located in a utility box positioned on an outside wall of the premises. The meter may include blades, which are received in the socket and held in place by a tension force applied to the blades by the socket.

During installation of a new meter, an old meter is removed from the meter socket and replaced with a new meter. As the old meter is replaced with the new meter, the meter socket may still be conducting electricity, or "hot", from utility power lines. Accordingly, the installation process is performed quickly and forcefully. For example, the old meter may be knocked or pulled out of the meter socket and blades of the new meter may be immediately forced into the meter socket to reestablish the electrical connection. In some instances, the installation of the new meter may create a phenomenon known as "arcing" where an electrical arc is formed in a gap between the meter blade and the meter socket as the meter is installed. Arcing may also occur randomly, subsequent to the installation period. For example, if the tension force of the socket is lessened, then gaps may occur between the blades and the socket. The gaps provide an environment conducive to arcing. The presence of arcing in an electric metering system may cause high heat, and in some instances, fire that may cause significant damage to the components of the electric meter systems and, potentially, the premises to which the electric meter system is connected. In addition, arcing in an electric metering system may injure humans, such as workers assisting with a meter replacement. Therefore, it is desirable to detect arcing conditions before any damage or endangerment occurs.

SUMMARY

An electrical metering system for a power utility supply may measure current levels or voltage levels associated with electrical signals transmitted via the electrical metering system. An electrical meter included in the electrical metering system may include a measurement circuit and a disconnect circuit. The disconnect circuit may include an actuator that is capable of interrupting electrical signals that are transmitted via the electrical metering system.

In an example implementation, the electrical meter is inserted in a meter socket such that electrical signals may be transmitted between the electrical meter and a meter socket. The measurement circuit produces measurements of voltage or current levels of the transmitted electrical signals. The measurements may be compared to one or more threshold levels, such as a threshold distortion level. Based on the comparison to the one or more thresholds, the electrical metering system may determine that an arcing condition is present in one or more of the electrical meter or the meter socket. Responsive to determining that the arcing condition is present, a disconnect signal may be provided to the disconnect circuit. In some cases, the actuator included in the disconnect circuit may trigger in response to the disconnect signal, interrupting the transmission of the electrical signals.

These illustrative embodiments are mentioned not to limit or define the disclosure, but to provide examples to aid understanding thereof. Additional embodiments are discussed in the Detailed Description, and further description is provided there.

DESCRIPTION OF THE DRAWINGS

Features, embodiments, and advantages of the present disclosure are better understood when the following Detailed Description is read with reference to the accompanying drawings, where.

DETAILED DESCRIPTION

Certain aspects and examples of the present disclosure relate to detecting conditions conducive to arcing and to electrically disconnecting the electric meter to prevent damage to the electric meter or premises proximate to the utility box. In some aspects, an electric meter may include a baseband arc detection system that monitors an electrical signal (e.g., an alternating current ("AC") signal) corresponding to the power supplied by a utility company to a premises. The electrical meter may determine measurements using the electrical signal and determine if such measurements are indicative of arcing conditions. In some aspects, characteristics of the electrical signals, such as distortion and noise, may be used to detect the existence of arcing conditions. The measurements may be determined using metrology components, such as hardware and software components, in the electric meter. The metrology components may be capable of measuring one or more of a voltage level or a current level associated with the electrical signal at a particular point in time, or at a series of points in time. A series of measurements may be stored, such as in a memory device associated with the electrical meter.

In additional and alternative aspects, an ion detector may be incorporated into the metrology components. The ion detector may detect ion levels in the utility box. An electrical arc in the utility box may generate ions by electrically charging the atoms in the utility box. The ion detector may include an ion antenna positioned to intercept the ions in the utility box. The ion detector may amplify the ions to a detectable level and generate an ion detection signal that may be used to determine if an arcing condition exists.

Arcing conditions may include conditions in the utility box indicating an actual electrical arc between a socket in the utility box and the electric meter located in the socket or conditions conducive to a possible electrical arc. The electric meter may include disconnect circuitry to disconnect the power to the electric meter from the socket to prevent or stop an electrical arc. In some aspects, the disconnect circuitry may be actuated remotely by a disconnect signal received from a remote device. The disconnect signal may be generated in response to a report from the electric meter that a potential electrical arc is occurring (or about to occur). In additional and alternative aspects, the disconnect circuitry may be actuated automatically in response to the measurement circuitry detecting conditions indicative of an electrical arc.

Figure 1:
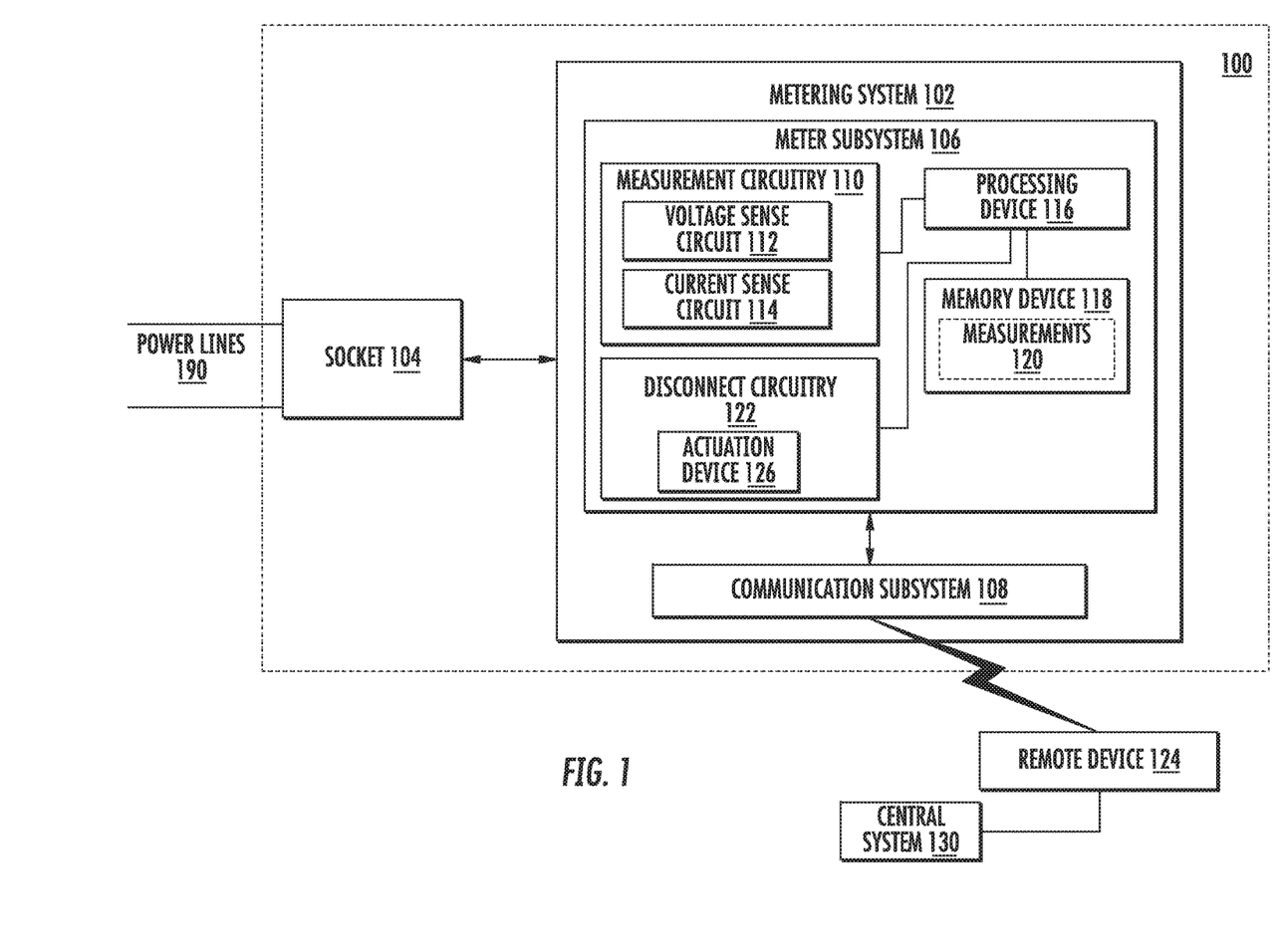
FIG. 1 is a block diagram depicting an example of an electrical metering system capable of detecting arcing conditions present in a utility box, according to some aspects.

FIG. 1 is a block diagram of a utility box 100 including an electrical metering system 102 and a meter socket 104. The metering system 102 may include components for detecting an electrical arc between the metering system 102 and the meter socket 104, according to some aspects of the present disclosure. The utility box 100 may be positioned proximate to the premises receiving power from a utility company. Power lines 190 may be electrically connected to the utility box 100 to supply power to the premises from the utility company. The power from the power lines 190 may be routed through the meter socket 104 to allow the metering system 102 positioned in the meter socket 104 to monitor the power levels consumed within the premises. In some aspects, the metering system 102 includes one or more blades that are sized to be positioned within an opening of the meter socket 104. Positioning the blades of the metering system 102 within the meter socket 104 electrically connects the metering system 102 to the meter socket 104. The meter socket 104 may include springs or other means to provide a tension force on the blades to maintain the position of the blades within the opening of the meter socket 104. The meter socket 104 and blades may each include one or more surfaces made out of a conductive material to allow electricity to flow between the meter socket 104 and the blades.

The metering system 102 includes an electrical meter subsystem 106 and a communication subsystem 108. The meter subsystem 106 includes components, including measurement circuitry 110, to allow the meter subsystem 106 to measure the power consumed by the premises. The measurement circuitry 110 may include a voltage sense circuit 112 and a current sense circuit 114 for measuring the voltage and current, respectively, from the electrical signals supplied to the premises through the power lines 190. In some aspects, the voltage sense circuit 112 may be connected to electric load terminals in the metering system 102, which are connected to the meter socket 104 via the blades of the metering system 102. The voltage sense circuit 112 may include, for example, amplifiers, resistors, or other electrical devices to generate a voltage sense signal corresponding to an instantaneous voltage from the power lines. The current sense circuit 114 may include, for example transformers, inductors, or other coils connected to the meter socket 104 via the blades of the metering system 102 to generate a current sense signal corresponding to an instantaneous current flowing from the power lines through the meter socket 104. Voltage sense signals and current sense signals generated by the voltage sense circuit 112 and the current sense circuit 114, respectively, may be routed to a processing device 116 for monitoring the signals and determining the power consumed by the premises. Based on one or more of the voltage sense signals and current sense signals, measurements 120 may be generated by the processing device 116.

The processing device 116 may include one or more processors communicatively coupled to a memory device 118. The processing device 116 is configured to execute instructions stored by the memory device 118 and includes, for example, a logical processing unit, a microprocessor, a digital signal processor, or other processing means for processing the signals received from the voltage sense circuit 112 and the current sense circuit 114. The memory device 118 includes volatile or non-volatile RAM, EEPROM, or other readable and writeable memory devices. For example, the memory device 118 may include a non-volatile memory that stores data representing the measurements 120 received from the voltage sense circuit 112 and the current sense circuit 114 and analyzed by the processing device 116. Additionally or alternatively, the memory device 118 may store one or more communications, such as communications received by or transmitted by the communication subsystem 108.

In some aspects, the measurements 120 may include AC line measurements, including, but not limited to, line noise measurements, line distortion measurements, and line zero-crossing measurements. The line noise measurements may correspond to the electrical noise, or random fluctuations, in the electrical signals flowing between the socket 104 and the metering system 102. Noise may include one or more signals having a frequency, voltage, current, or other properties having values outside the normal range of properties for electrical signals supplied by the power utility company. The noise may correspond to unwanted or excess energy in the utility box 100 or other sources. The line distortion measurements may correspond to a threshold of distortion of the AC signals flowing between the socket 104 and the metering system 102. The line distortions may correspond to deviations from a normal sinusoidal pattern of the electrical signals supplied by the power utility company via the power lines 190. The zero-crossing measurements may correspond to the time or frequency at which the AC signals cross a zero level during an AC cycle. At the zero-crossing, no voltage or current is present in the electrical signal.

The meter subsystem 106 also includes disconnect circuitry 122. In some aspects, the disconnect circuitry 122 includes a switching device or other means for disconnecting the power supplied from the power lines 190 to the premises through the utility box 100. Disconnecting the power may include interrupting electrical signals that are transmitted between the meter socket 104 and the metering system 102. The disconnect circuitry 122 may also include an actuation device 126 coupled to the switching device. The actuation device 126 may cause the switching device to transition from a first position that allows power to flow into the premises to a second position that prevents the power from flowing into the premises, and from the second position to the first position. The actuation device 126 may be communicatively coupled to the processing device 116, which may transmit control signals to the disconnect circuitry 122 to allow the processing device 116 to operate the switching device. The processing device 116 may generate and transmit a control signal to the disconnect circuitry 122 in response to a determination of an arcing condition in the utility box 100. Additionally or alternatively, the processing device 116 may generate and transmit the control signal in response to a remote signal being transmitted to the metering system 102 from a remote device 124. In some aspects, the disconnect circuitry 122 may include components capable of modifying the control signal received from the processing device 116 to a signal appropriate to trigger the actuation device 126. For example, the control signal may be modified from a low-level voltage control signal to a higher-current signal capable of triggering a motorized actuator.

The metering system 102 may be communicatively coupled to the remote device 124 through a communication subsystem 108. In some aspects, the communication subsystem may include one or more communication devices, such as a communication antenna and a radio, to send and receive message signals through a network between the metering system 102 and the remote device 124. For example, message signals including a communication from the processing device 116 may be transmitted via the communication subsystem 108 to the remote device 124, via one or more of a local area network, a wireless network, a wide area network, an intranet, the Internet, or any other suitable network. In some aspects, the communication subsystem 108 may be communicatively coupled to the processing device 116. In other aspects, the communication subsystem 108 may include separate processing, memory, or data storage means. The remote device 124 may include a computing device and may be positioned at a location separate from the metering system 102 (e.g., at another premises or on a nearby utility pole). In some aspects, the remote device 124 is mobile, such as a remote device included in a service vehicle. The remote device 124 may be communicatively coupled to multiple metering systems and may communicate power consumption across a network to a central system 130, such as a central system associated with an operator of the power utility. In some aspects, the communication subsystem 108 may transmit a report indicating an arcing condition in the utility box 100. The central system 130 may process the report and, in response, transmit a signal instructing the meter subsystem 106 to disconnect the power to the premises via the disconnect circuitry 122.

Figure 2:
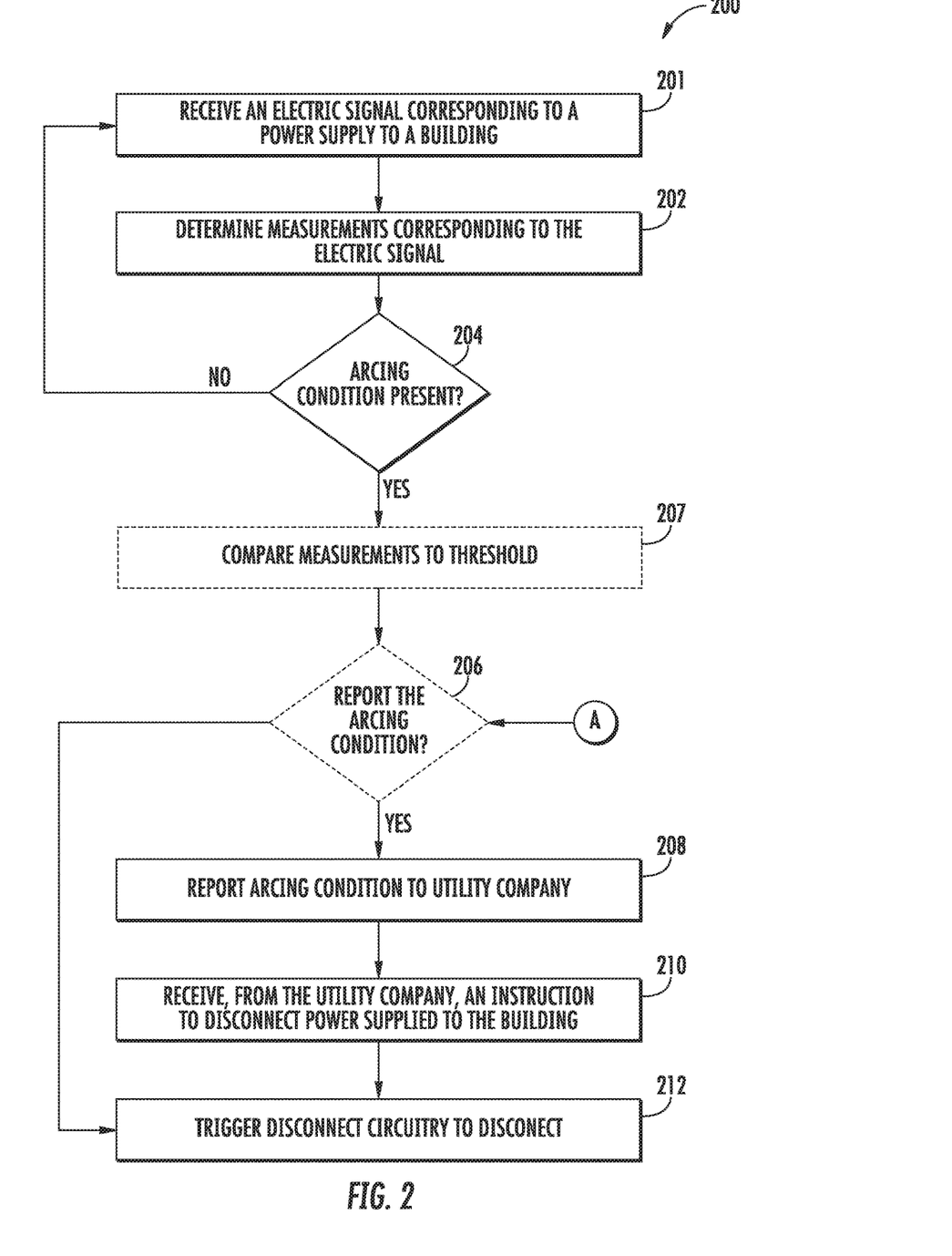
FIG. 2 is a flow chart of operations performed by a microprocessor, for detecting an arcing condition in the utility box using received measurements, according to some aspects.

FIG. 2 is a flow chart of a process 200 for detecting an arcing condition in the utility box 100 using the measurements 120 received from the measurement circuitry 110 according to some aspects of the present disclosure. The process is described with respect to the metering system 102 of FIG. 1, though other implementations are possible without departing from the scope of the present disclosure.

In block 201, the utility box 100 receives electrical signals, the electrical signals corresponding to power signals from a utility company for supplying power. The electrical signals, or a signal based on the electrical signals, may be received by the processing device 116. The signals received by the processing device 116 may be digitized, such as by an analog-to-digital converter. Additionally or alternatively, the signals may be scaled, such as to a current or voltage level smaller than the current or voltage level of the electrical signal supplied by the utility company. In some aspects, a current sense signal corresponding to the electrical signals may be generated by the current sense circuit 114, such as a current sense signal indicating a momentary current level based on the received electrical signals at a certain point in time. In other aspects, a voltage sense signal corresponding to the electrical signals may be generated by the voltage sense circuit 112, such as a voltage sense signal indicating a momentary voltage level based on the received electrical signals at the certain point in time.

In some aspects, the current sense signal or the voltage sense signal may be scaled or digitized by the measurement circuitry 110. For example, the measurement circuitry 110 may receive from a transformer electrical signals that are scaled to a lower level, such that the current sense signal or the voltage sense signal are based on the lower level. Additionally or alternatively, the measurement circuitry 110 may include components, such as a voltage divider or current divider, capable of scaling the voltage or current level of received electrical signals, such that the current sense signal or the voltage sense signal are based on the scaled electrical signals. In addition, the measurement circuitry 110 may include components capable of providing a digital signal based on a received analog signal, such as an analog-to-digital converter.

In block 202, the measurements 120 of the electrical signals are determined. For example, measurement circuitry 110 may produce measurements 120 based on one or more of the current sense signal or the voltage sense signal. In some aspects, the measurements 120 include at least a line noise measurement, a line distortion measurement, and a line zero-crossing measurement.

In decision block 204, the measurements 120 are used to determine if an arcing condition is present in the utility box 100. In some aspects, each of the measurements 120 may be compared, by the processing device 116, to threshold measurements stored in the memory device 118. The threshold may be a predetermined value that is indicative of an arcing condition in the utility box 100. In some aspects, the threshold measurements may include values determined based on simulations, historical data stored in the memory device 118 or in a remote storage unit, information provided via the communication subsystem 108, or other information previously determined to indicate an arcing condition. For example, based on historical data stored in the memory device, the processing device 116 may determine a learned pattern of measurements that are expected to occur in the utility box 100. The processing device 116 may determine one or more thresholds with respect to the learned pattern of expected measurements.

In additional and alternative aspects, the threshold measurements may include values that are a standard deviation or order of magnitude away from normal or average measurements of the electrical signal. In some aspects, a single measurement that is determined to be beyond the threshold may be indicative of an arcing condition. In additional and alternative aspects, an arcing condition may be determined where a combination of two or more measurements is each beyond its respective threshold. Where no arcing condition is detected, the processing device 116 may continue to monitor the signals received from the measurement circuitry 110.

In some aspects, a determination of an arcing condition may be determined by one or more additional processes. For example, a process 600, as described in regards to FIG. 6, may determine that arcing conditions exist in the utility box 100. The process 600 may provide an indication of this determination to process 200, such as at point A in process 200. Subsequent to receiving the indication from the additional process, the process 200 may continue to a sub-process for disconnecting the power supply from the power lines to the premises, such as described in blocks 206-212.

In process 200, subsequent to determining that an arcing condition exists, a sub-process is implemented in blocks 206 to 212, to disconnect the power supply from the power lines to the premises. In decision block 206, an optional determination (as indicated by the dotted lines of decision block 206) is made to report at least one of the arcing condition or the measurements 120 indicative of the arcing condition to the remote device 124. A report may comprise a set of digital information transmitted via one or more networks, such as a communication transmitted by the communication subsystem 108. The report may include information indicating one or more of the presence of the arcing condition, the severity of the arcing condition, the location of the metering system 102, or any other suitable information.

In some aspects, the determination to report is made based on an additional threshold corresponding to how far one or more of the measurements 120 are beyond the predetermined threshold used to determine an arcing condition in decision block 204. In block 207, an optional comparison (as indicated by the dotted lines of block 207) is made between an additional threshold and one or more of the measurements 120. For example, a measurement 120 above but still close to the threshold may indicate a potential arc and require additional analysis to determine whether disconnection is warranted. A measurement 120 far exceeding the predetermined threshold may definitively indicate an actual electrical arc in the utility box 100 and require immediate disconnection of the power supply to the metering system 102. In some aspects, one or more of the measurements 120 are compared to multiple thresholds. For example, a value from the measurements 120 may be compared to a first threshold that is associated with a relatively low probability of an arcing condition. Additionally, the value may be compared to a second threshold is associated with a relatively high probability of an arcing condition. In some cases, the value may be compared to one or more additional thresholds. The determination to disconnect the power supply to the metering system 102, or to report the possibility of the arcing condition, may be based on the results of comparing the value to the multiple thresholds.

In additional and alternative aspects, the processing device 116 may be further configured to both send a report and cause immediate disconnection of the metering system 102. In one example, after a report has been sent to the remote device 124, the processing device 116 may continue to monitor for arcing conditions and may receive a measurement 120 definitively indicating an electrical arc, responsive to which the processing device 116 sends a disconnection signal to the disconnection circuit 122. In another example, the processing device 116 sends a disconnection signal to the disconnection circuit 122 and sends a report to the remote device 124 to report or confirm the disconnection event.

In block 208, subsequent to a determination that a report is warranted, the processing device 116 generates the report and routes the report to an antenna, transmitter, or other transmitting means in the communication subsystem 108 to transmit the report to the remote device 124. In some cases, the processing device 116 provides instructions to the communications subsystem 108. The communication subsystem 108 may transmit the report to the remote device 124, responsive to receiving instructions from the processing device 116. The remote device 124 may determine that disconnection is warranted or not warranted based on additional analysis or review of the measurements 120 or other information included in the report. Additionally or alternatively, the remote device 124 may communicate some or all of the measurements 120 to a central system 130 for analysis.

In block 210, the processing device 116 receives an instruction signal from the remote device 124. The instruction signal may correspond to an instruction to disconnect the metering system 102 from the power supplied to the premises by the power lines connected to the utility box 100. The instruction signal may be received from the remote device 124 via an antenna, receiver, or other receiving means of the communication subsystem 108. In some aspects, the communication subsystem 108 may route the instruction signal to the processing device 116 for disconnecting the metering system 102. In other aspects, the communication subsystem 108 may route the instruction signal directly to the disconnect circuitry 122.

In block 212, the disconnect circuitry 122 is triggered to cause the disconnect circuitry 122 to disconnect the metering system from the power supplied to the premises to stop the arcing condition. In some aspects, the disconnect circuitry 122 may be triggered by a control signal generated by the processing device in response to the processing device 116 receiving a command from the remote device 124, as described in regards to block 210. In further aspects, the disconnect circuitry 122 may be triggered by the processing device 116 in response to a determination that an arcing condition has occurred as described in regards to decision block 204.

In certain aspects, the disconnect circuitry 122 may be triggered by the actuation device 126 of the disconnect circuitry receiving a signal indicating that the power to the premises should be disconnected. The actuation device 126 may be connected to a switch and, in response to receiving the signal, may cause the switch to transition to a position that breaks a circuit between the power lines and the premises, interrupting the transmission of electrical signals between the meter socket 104 and the metering system 102.

Figure 3A:
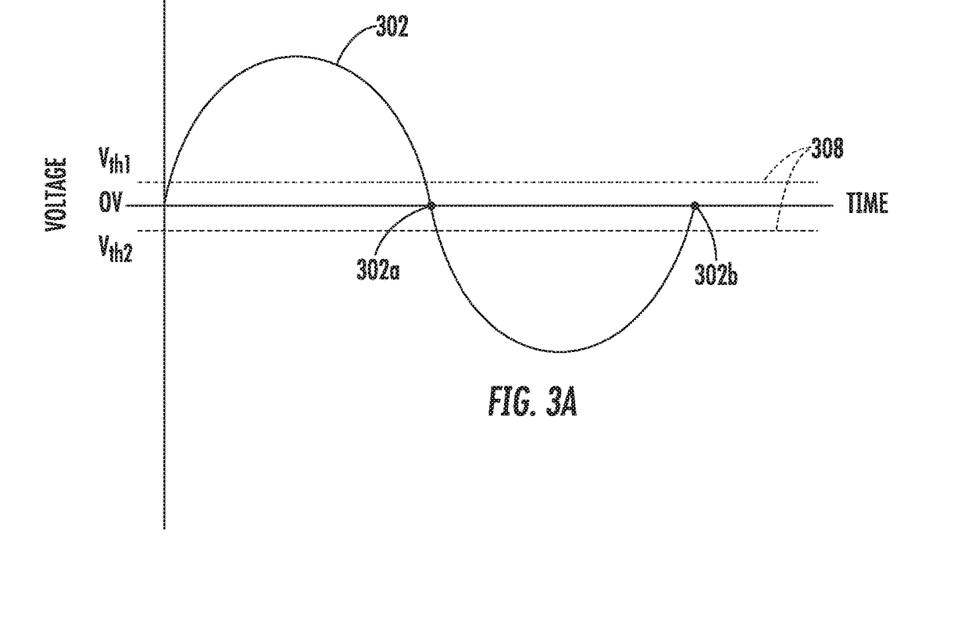
FIGS. 3a and 3b (collectively, FIG. 3) depict graphs showing electrical signals transmitted between a meter socket and an electrical metering system, according to some aspects.
Figure 3B:
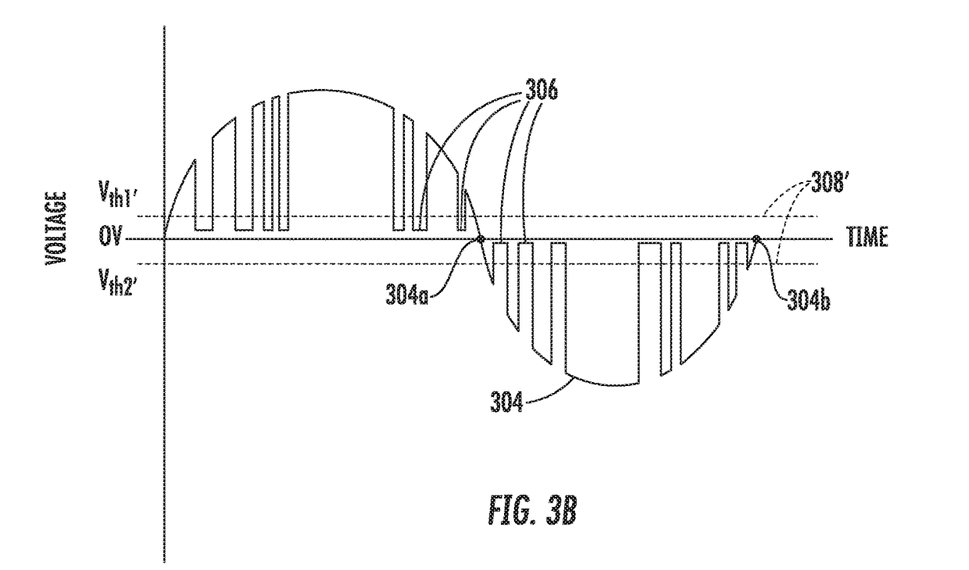

FIGS. 3a and 3b (collectively, FIG. 3) depict graphs showing electrical signals, such as electrical signals transmitted between the meter socket 104 and the metering system 102. FIG. 3a depicts a graph of a voltage of an ideal electrical signal 302 versus time. The ideal electrical signal 302 is a sinusoidal waveform that may represent at least one of the current sense signal or the voltage sense signal. The ideal electrical signal 302 shown in FIG. 3a has no visible distortions indicating that the electrical signal is flowing under normal conditions (e.g., no arcing condition is present). Normal conditions may include electrical signals with ideal (or near-ideal) electrical properties. Ideal electrical properties may include a particular expected voltage level, such as 120 V, 277 V, 347 V, or 480 V; a particular waveform (e.g., "envelope"), such as sinusoidal or triangle; or a particular expected frequency, such as 60 Hz or 50 Hz. In some aspects, the ideal electrical properties for electrical signals delivered to a premises may depend on one or more of the function of the premises (e.g., residential, manufacturing) or a location of the premises (e.g., North America, Europe). A threshold level, such as threshold level 308, may indicate a measurement, or range of measurements, that is outside of the normal operating conditions of power supplied by the utility company. For example, the threshold level 308 may indicate a pair of voltages $V_{th1}$ and $V_{th2}$ that correspond to voltage levels close to zero volts (e.g., +5 V and −5 V). Under normal operating conditions, an ideal waveform of electrical signal 302 may be expected to have a voltage level between $V_{th1}$ and $V_{th2}$ twice per cycle. For example, if the ideal electrical signal 302 has an expected frequency of 60 Hz (e.g., 60 cycles per second), the voltage level of the ideal electrical signal 302 is expected to have a 0V voltage level 120 times per second, such as at the zero-crossing points 302a and 302b. In additional aspects, measurements of the ideal electrical signal 302 may be expected to indicate a voltage level greater than $V_{th2}$ and less than $V_{th1}$ approximately 120 times per second, such as for a set of measurements sampled within a range of times at or around the zero-crossing points 302a and 302b.

Although the ideal electrical signal 302 is shown with no visible distortions, an electrical signal may include some distortions without being indicative of an arcing condition. For example, some distortions may occur on the electrical signal based on a sudden change in electrical operations on the premises (e.g., turning on or off a drying machine or air conditioning unit). In some aspects, some distortions in the electrical signal may be expected based on information previously determined about the operation of the utility box 100 or the power signals flowing into the utility box 100 from the power lines 190 of FIG. 1. In some aspects, determining whether arcing conditions exist may be based in part on historical information about the operation of the utility box 100 or the power signals, such as a learned pattern of operation based on historical measurements 120 stored in the memory device 118.

FIG. 3b depicts a graph of a voltage of a distorted electrical signal 304 versus time. The distorted electrical signal 304 visually represents a measurement that is indicative of an arcing condition according to some aspects of the present disclosure. The measurement may be compared to a threshold distortion value, such as the threshold level 308' indicating a pair of voltages $V_{th1}'$ and $V_{th2}'$. The threshold distortion value may include a value corresponding to an amount of distortion beyond what has been determined to be caused during normal conditions, such as a maximum level of distortion associated with normal operating conditions. In FIG. 3b, the distorted electrical signal 304 visually represents a threshold value of distortions 306 that indicates an arcing condition in the utility box 100. In the example of the distortions 306 shown in FIG. 3b, the distortions indicative of an arcing condition include brief points in the waveform where the electrical signal returns to zero and then resumes on the envelope of the ideal electrical signal 302. A comparison of the distorted electrical signal 304 to the threshold level 308' may indicate that the measurements of the distorted electrical signal 304 are outside of normal operating conditions. In some aspects, such distortions 306 may also be measured by the zero-value crossing measurement as the distortions 306 cause the value of the electrical signal to briefly return to zero. For example, a comparison of the threshold level 308' with voltage levels associated with the distortions 306 may indicate that the voltage level of the distorted electrical signal 304 is between $V_{th1}'$ and $V_{th2}'$ more often than is expected for an associated ideal electrical signal. Responsive to determining that the measurements are outside of normal operating conditions (e.g., arcing conditions are present), a disconnect signal may be sent to disconnect circuitry 122.

Although the example threshold levels 308 and 308' are depicted as pairs of voltages, other implementations of threshold levels are possible. For example, a threshold level may represent one or more of a minimum or maximum voltage level, a range of voltage levels, a minimum or maximum current level, a range of current levels, an area related to an electrical signal (e.g., an area calculated under a waveform), a quantity of zero-crossings, a frequency content of the voltage or current signal, or any other suitable threshold value. Additionally or alternatively, the threshold level may represent combination of one or more values, such as a rate of change of a suitable value, a voltage level combined with a frequency content of the voltage signal, a rate of change of a suitable value, a quantity of value occurrences within a span of time, or any other suitable combination of values.

Figure 4:
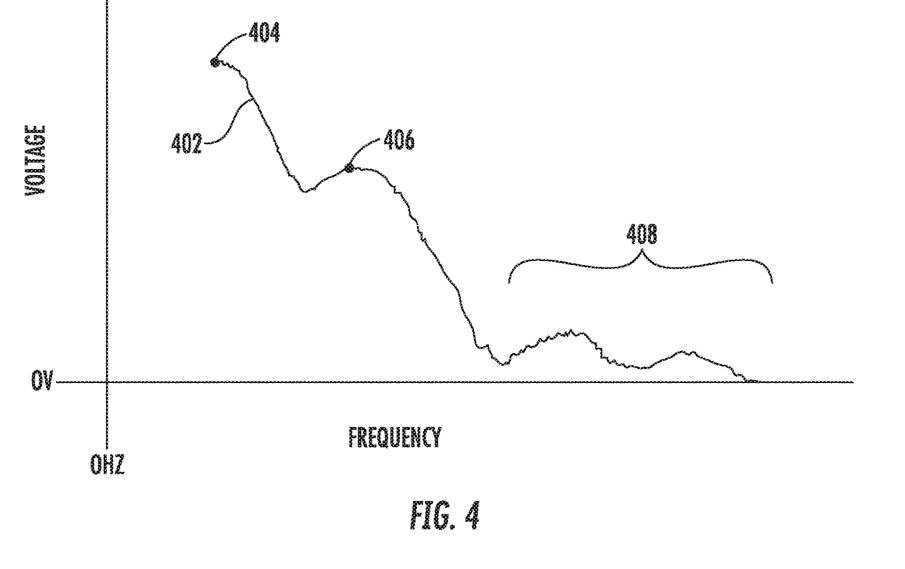
FIG. 4 depicts a frequency spectrum graph depicting the amplitude of the voltage of an electrical signal versus the frequency of the electrical signal, according to some aspects.

In some aspects, measurements 120 are derived from additional properties of electrical signals transmitted between the meter socket 104 and the metering system 102. For example, based on the voltage sense signal or the current sense signal, the measurement circuitry 110 may derive a measurement 120 of the frequency content of the received electrical signals. FIG. 4 is a spectral graph 400 depicting the amplitude of the voltage of an electrical signal 402 versus the frequency of the electrical signal 402 according to some aspects of the present disclosure. Point 404 represents the AC line frequency of the electrical signal 402, such as the fundamental frequency of an AC power signal received on power lines 190. In some aspects, the AC line frequency may have a frequency value of 60 Hz, represented at point 404. Point 406 of the electrical signal 402 represents the second harmonic of the electrical signal 402. In some aspects, the second harmonic may have a frequency value equal to twice the value of the AC line frequency, such as 120 Hz. Following point 406 is a visual representation of the noise 408 of the electrical signal 402. In some aspects, the noise 408 may correspond to the distortions 306 of the distorted signal 304 of FIG. 3. A derived measurement of the noise 408 may be monitored and compared to a threshold value. A comparison of the noise 408 to the threshold level may indicate that the measurements (including derived measurements) of the electrical signal 402 are outside of normal operating conditions. Responsive to determining that the measurements are outside of normal operating conditions (e.g., arcing conditions are present), a disconnect signal may be sent to disconnect circuitry 122.

A derived measurement of the noise 408 may be determined using any suitable method. For example, an area associated with the electrical signal 402 (e.g., an area calculated under the frequency waveform of signal 402) may be compared to a threshold value. An area under the electrical signal 402, or under a portion of the electrical signal 402 (e.g., a portion of the waveform corresponding to frequencies greater than point 406) may be calculated. The calculated area may be compared to a threshold value indicating an expected amount of noise under normal operating conditions (e.g., an area of an ideal frequency waveform, or portion thereof). Based on a comparison to the threshold value, the measurement of the noise 408 may indicate an arcing condition. For example, if the calculated area associated with noise 408 exceeds a threshold value for an ideal frequency waveform (e.g., the noise 408 exceeds an ideal amount of noise), a determination may be made that an arcing condition is present. Responsive to this determination, a disconnect signal may be sent to disconnect circuitry 122.

In some aspects, the processing device 116 may determine a learned pattern indicating normal operating conditions of the utility box. For example, the memory device 118 may store a set of historical measurements describing the electrical signals received over a relatively long period of time (e.g., days, weeks, months). The processing device 116 may analyze the historical measurements to determine a pattern of measurements, such as a relatively short series of measurements indicating noise (e.g., approximately one second). In addition, the processing device 116 may determine that the pattern of measurements happens regularly, such as several times per day. Based on the analysis of the historical measurements, the processing device may determine a learned pattern of measurements, such as a pattern of measurements that include noise but which do not indicate arcing conditions. The learned pattern may represent normal operating conditions of the premises associated with the utility box.

In some aspects, the processing device 116 may determine one or more learned thresholds that are based on the learned patterns. In additional aspects, the processing device 116 may determine whether an arcing condition is present based on a combination of thresholds (including learned thresholds). For example, the processing device 116 may determine a learned pattern that includes a relatively short series of zero-crossings that lasts for less than one second, followed by a relatively longer series of voltage measurements, each of which include a frequency of 240 Hz, such as might result from a relatively heavy motor (e.g., an air conditioning unit) turning on. Additionally or alternatively, the processing device 116 may determine a learned threshold that includes the learned pattern. For example, the learned threshold may include a series of zero-crossings lasting longer than one second, combined with voltage measurements that include frequencies above 240 Hz. Responsive to receiving measurements indicating that the operating conditions are outside of the learned threshold, the processing device 116 may determine that an arcing condition is present in the utility box.

Figure 5:
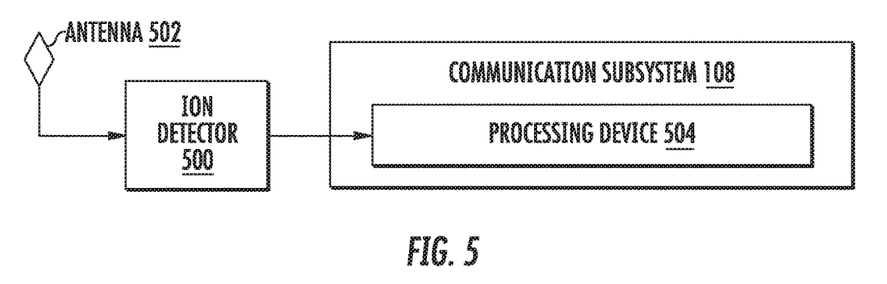
FIG. 5 is a block diagram depicting an example of an ion detector that may be included in an electrical metering system, according to some aspects.

FIG. 5 is a block diagram of an ion detector 500 that may be included in the metering system 102 of FIG. 1 according to some aspects of the present disclosure. The ion detector 500 is communicatively coupled to an antenna 502 that is configured to sense, detect, or otherwise receive ions. Although the antenna 502 is shown as separate from the ion detector 500, in some aspects, the antenna 502 may be integral to the ion detector 500. The antenna 502 may include a component having a material that is suitable for coupling to low energy (e.g., ions), such as copper, plated steel, or any other suitable material. The ion detector may include any circuit for generating an ion detection signal indicating the presence of ions in the utility box 100 as received by the antenna 502. Ions may occur in conditions that are conducive to arcing. For example, ions may occur in proximity to a surface that has an electrical potential that is different from other surfaces nearby or materials (including air) surrounding the first surface. An increase in ions may indicate that the difference in electrical potential is increasing between the first surface and the surroundings. A difference in electrical potential between surfaces may lead to conditions conducive to arcing, and an increasing difference in electrical potential may result in conditions that are increasingly conducive to arcing between the surfaces. Detecting an increase in a level of ions, such as a level or ions near a surface in one or more of the metering system 102 or the meter socket 104, may allow detection of arcing conditions.

In some aspects, one or more of the measurements 120 may indicate a detected level of ions. Additionally or alternatively, a determination of whether arcing conditions are occurring in the utility box 100 may be based on a detected level of ions combined with additional information, such as additional measurements describing a voltage level or a current level, or a learned pattern determined by the processing device 116. In additional aspects, a learned pattern may be based at least in part on historical levels of detected ions.

Non-limiting examples of an ion detector may include an electronic circuit including an operational amplifier or a junction gate field-effect transistor (JFET). In some aspects, the ion detector 500 may amplify the ions received by the antenna 502 to a level detectable by a processing device and may generate a signal corresponding to the ion detection levels for transmitting to the processing device. In FIG. 5, the ion detector 500 is electronically coupled to a processing device 504 of the communication subsystem 108. The processing device 504 may be similar in type to the processing device 116 of the meter subsystem 106 of FIG. 1. Although the ion detector 500 is shown as coupled to the processing device 504 of the communication subsystem 108, it may alternatively be coupled to the processing device 116 of the meter subsystem 106 without departing from the scope of the present disclosure.

In some aspects, one or more of the ion detector 500 or the antenna 502 may be positioned in the utility box 100 of FIG. 1 in an expected ion path. The expected ion path may include any location or path in the utility box 100 where ions present in the utility box 100 may be found. For example, in some aspects, the antenna 502 may be positioned proximate to the socket 104 or the blade or outer surface of the metering subsystem 102 to detect ions generated in response to an electrical arc. In another example, the antenna 502 may be positioned near an egress of the utility box 100 (e.g., on a screw head of screw positioned in an opening of the utility box 100) to intercept ions as they attempt to exit the utility box 100 into the surrounding environment.

Figure 6:
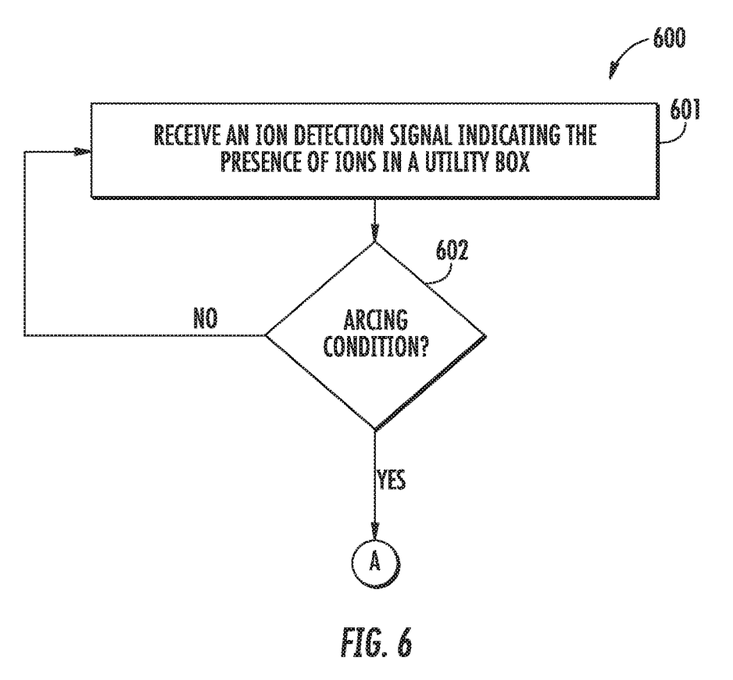
FIG. 6 is a flow chart of operations performed by a microprocessor, for detecting an arcing condition in a utility box using ion level measurements, according to some aspects.

FIG. 6 is a flow chart of a process 600 for detecting an arcing condition in the utility box 100 using ion level measurements according to some aspects of the present disclosure. The process 600 is described with respect to the metering system 102 of FIG. 1 and the ion detector 500 of FIG. 5, though other implementations are possible without departing from the scope of the present disclosure.

In block 601, an ion detection signal is received. The ion detection signal may be received by the processing device 504 or another processing device in the metering system that is electrically coupled to the ion detector 500 (e.g., the processing device 116). The ion detection signal may be generated by the ion detector 500 and correspond to ion levels in the utility box 100.

In decision block 602, the processing device 504 determines whether an arcing condition exists. In some aspects, the processing device 504 may determine an arcing condition in binary fashion. For example, the processing device 504 may determine that an arcing condition exists where the ion detection signal indicates that ion levels are increased in the utility box 100 and that no arcing condition exists where the ion levels in the utility box 100 are within a normal range. In additional aspects, the processing device 504 may be communicatively coupled to a storage device including a threshold value of an ion detection level indicating an arcing condition. The processing device 504 may compare the ion detection signal with the threshold value. If the ion detection signal corresponds to a value meeting or exceeding the threshold value, the processing device 504 may determine that an arcing condition exists. The processing device 504 may continue to monitor the ion levels generated by the ion detector 500 when no arcing conditions are determined. Subsequent to a determination of an arcing condition, such as at point A in process 600, the process 600 may continue to a sub-process for disconnecting the power supply from the power lines to the premises, such as described in blocks 206-212 of FIG. 2.

Figure 7A:
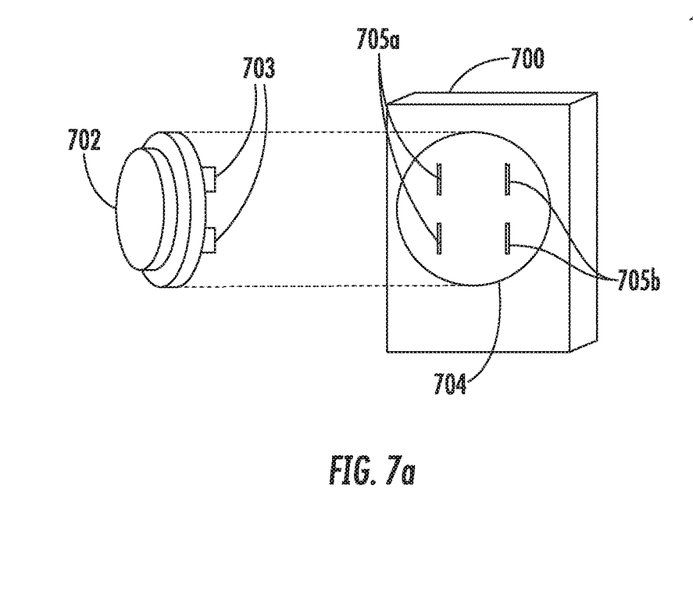
FIGS. 7a and 7b (collectively, FIG. 7) are block diagrams depicting examples of an electrical meter, a utility box, and a meter socket, according to some aspects.
Figure 7B:
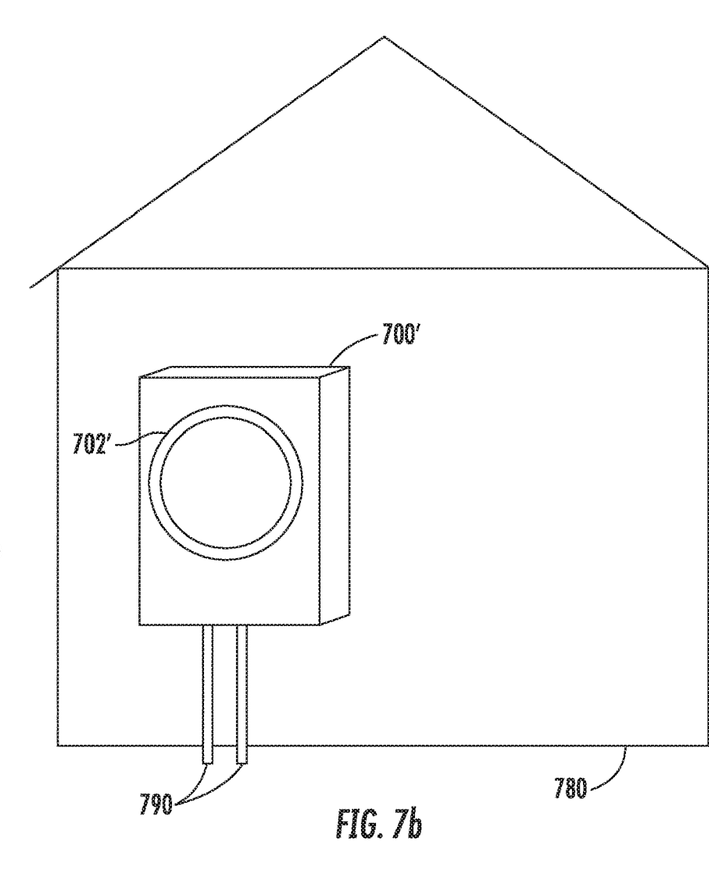

FIGS. 7a and 7b (collectively, FIG. 7) are block diagrams of a an electrical metering system, a utility box, and a meter socket. FIG. 7a is a diagram depicting an electrical metering system 702. The electrical metering system 702 includes one or more blades, such as blades 703, and a utility box 700 including a meter socket 704. The meter socket 704 includes openings 705 (including utility-side openings 705a and premises-side opening 705b) into which the blades 703 may be positioned. The metering system 702 may be fitted into the meter socket 704, as indicated by the dotted lines in FIG. 7a, such that the blades 703 positioned in the openings 705. Positioning the blades 703 within the opening 705 electrically connects the electrical metering system 702 to the meter socket 704.

The blades 703 and the openings 705 may be configured such that electrical signals are transmitted between a utility side of the meter socket 704 and the electrical meter 702, and between the electrical meter 702 and a premises side of the meter socket 704. For example, electrical signals received from the utility company may be transmitted to the electrical meter 702 via the utility-side openings 705a and blades (not visible in FIG. 7a) on the utility side of the electrical meter 702. In addition, the electrical signals may be transmitted to the premises via the blades 703 on the premises side of the electrical meter 702 the premises-side openings 705b. The electrical meter 702 may perform operations as the electrical signals are transmitted between the utility side and the premises side, including generating voltage sense or current sense signals, determining measurements 120, executing operations performed by processing device 116, and other operations described herein. In some aspects, the electrical meter 702 is configured such that disconnect circuitry (such as disconnect circuitry 122) allows the electrical signals to be transmitted between the utility side and the premises side. For example, the disconnect circuitry 122 may be configured such that triggering the actuation device 126 may interrupt the transmission of the electrical signals between the utility side and the premises side, such as by interrupting the transmission of electrical signals between the blades on the utility side and the blades on the premises side of the electrical meter 702.

FIG. 7b is a diagram depicting an example configuration of a utility box 700' and an installed electrical metering system 702'. The installed electrical metering system 702' may be positioned in a meter socket (not visible in FIG. 7b) included in the utility box 700'. The utility box 700' may be positioned proximate to a premises 780 which receives power from a utility company. Power lines 790 may be electrically connected to the utility box 700' to supply power to the premises 780 from the utility company. The power from the power lines 790 may be routed through the meter socket included in the utility box 700', such as by being transmitted between utility-side and premises-side meter socket openings via the installed electrical metering system 702'. The installed electrical metering system 702' may meter power supplied via the power lines 790, such as to determine an overall power usage by the premises 780. In additional aspects, the installed electrical metering system 702' may determine measurements (such as measurements 120) of the power supplied via the power lines 790.

The processes described herein may be implemented using as computer-executable instructions that, when executed by a processing device cause the processing device or other devices controlled by the processing device to perform the appropriate operations. The instructions may be stored on a computer-readable medium such as (but not limited to) an electronic, optical, magnetic, or other storage device capable of providing a processing device with computer-readable instructions. The instructions may comprise processor-specific instructions generated by a compiler and/or an interpreter from code written in any suitable computer-programming language.

While the present subject matter has been described in detail with respect to specific aspects, it will be appreciated that those skilled in the art, upon attaining an understanding of the foregoing may readily produce alterations to, variations of, and equivalents to such aspects. Accordingly, it should be understood that the present disclosure has been presented for purposes of example rather than limitation, and does not preclude inclusion of such modifications, variations, or additions to the present subject matter as would be readily apparent to one of ordinary skill in the art. Indeed, the methods and systems described herein may be embodied in a variety of other forms. Furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

What is claimed is:

1. A system to detect electrical arcing conditions between an electrical meter and a meter socket in a utility box capable of providing a metered utility to a premises, the system comprising:
   the electrical meter configured to transmit utility electrical signals from a utility side of the meter socket to a premises side of the meter socket, the electrical meter having a disconnect circuit capable of interrupting the transmission of the utility electrical signals;
   a measurement circuit capable of producing a set of measurement values of the utility electrical signals transmitted by the electrical meter; and
   a processor capable of communicating with the measurement circuit and the disconnect circuit;
   wherein the processor is capable of:
      receiving the set of measurement values,
      comparing one of the values of the set of measurement values to a threshold,
      determining, based on the one of the values being within a first range from the threshold, that a potential arcing condition is present,
      in response to determining that the potential arcing condition is present, providing an indication of the potential arcing condition to a communication subsystem and instructing the communication subsystem to transmit the indication of the potential arcing condition to a central system,
      determining, based on the one of the values being outside of the first range and within a second range from the threshold, that an existing arcing condition is present, and
      in response to determining that the existing arcing condition is present, providing a disconnect signal to the disconnect circuit,
   wherein the disconnect circuit is configured to receive the disconnect signal and disconnect the premises from the utility electrical signals.

2. The system of claim 1, wherein:
the set of measurement values consists of one or more of:
a voltage measurement of the utility electrical signals,
a current measurement of the utility electrical signals,
or a zero-crossing measurement of the utility electrical signals,
the processor is further capable of determining a line distortion measurement value based on the one or more of the voltage measurement, the current measurement, or the zero-crossing measurement,
wherein comparing the one of the values of the set of measurement values to the threshold includes comparing the line distortion measurement value to a threshold distortion value corresponding to a level of distortion associated with normal operating conditions, and
determining that the existing arcing condition is present includes determining that the line distortion measurement value exceeds the threshold distortion value.

3. The system of claim 1, wherein:
the set of measurement values includes one or more values indicating a zero-crossing measurement value, and
wherein comparing the one of the values to the threshold includes (i) determining a quantity of the one or more values indicating the zero-crossing measurement value, and (ii) comparing the quantity to a threshold distortion value corresponding to a threshold number of zero-crossing measurement values.

4. The system of claim 1, wherein the processor is further capable of:
determining, based on the set of measurements, a frequency spectrum of the utility electrical signals,
determining an amplitude of a particular frequency included in the frequency spectrum, and
determining that the particular frequency is outside of a harmonic range of a fundamental frequency of the utility electrical signals,
wherein comparing the one of the values of the set of measurement values to the threshold includes comparing the amplitude of the particular frequency to a threshold amplitude corresponding to an expected amplitude associated with frequencies outside the harmonic range.

5. The system of claim 1, wherein the processor is further capable of providing, in response to determining that the existing arcing condition is present, an indication of the existing arcing condition to the communication subsystem, and instructing the communication subsystem to transmit the indication of the existing arcing condition to a central system.

6. The system of claim 1, wherein providing the disconnect signal to the disconnect circuit is further responsive to receiving an instruction signal from a remote device.

7. The system of claim 1, wherein the electrical meter further includes the measurement circuit, the processor, and a memory capable of storing one or more measurement values from the received set of measurement values.

8. The system of claim 7, wherein the processor is further capable of, based on the stored measurement values, determining a learned pattern, wherein the learned pattern indicates a pattern of measurements indicating a normal operating condition of the utility box.

9. The system of claim 8, wherein the threshold is based on the learned pattern.

10. A method of disconnecting a utility provided to a premises via an electric meter installed in a utility box, the method comprising:
based on historical data received from multiple electrical meters, determining a threshold level, wherein the threshold level corresponds to a value associated with a normal operating condition;
receiving, from a first electrical meter installed in a first utility box, a first measurement value of an operating condition within the first utility box, the first measurement value indicating one or more of an ion level within the first utility box, a first voltage level of a utility electrical signal transmitted to the first electrical meter, or a first current level of the utility electrical signal transmitted to the first electrical meter;
determining, based on a comparison of the first measurement value to the threshold level, that the operating condition within the first utility box includes an existing arcing condition,
in response to determining that the operating condition within the first utility box includes the existing arcing condition, providing a disconnect signal to the first electrical meter;
receiving, from a second electrical meter installed in a second utility box, a second measurement value of an operating condition within the second utility box, the second measurement value indicating one or more of an ion level within the second utility box, a second voltage level of a utility electrical signal transmitted to the second electrical meter, or a second current level of the utility electrical signal transmitted to the second electrical meter;
determining, based on a comparison of the second measurement value to the threshold level, that the operating condition within the second utility box includes a potential arcing condition; and
in response to determining that the second utility box includes a potential arcing condition, providing the second measurement value to a central system.

11. The method of claim 10, wherein:
the first measurement value is received from the first electrical meter via a communication subsystem included in the first electrical meter, and
the disconnect signal is provided to the first electrical meter via the communication subsystem.

12. The method of claim 10, wherein:
the first measurement value includes one or more of the first voltage level or the first current level, and
the threshold level includes a threshold distortion range corresponding to an expected level of distortion associated with the normal operating condition within the first utility box;
the method further comprising:
determining, based on one or more of the first voltage level or the first current level, a line distortion measurement value associated with the first voltage level or the first current level of the utility electrical signal transmitted to the first electrical meter; and
comparing the line distortion measurement value to the threshold distortion range,
wherein the determining that the operating condition within the first utility box includes the existing arcing condition is further based on the comparison of the line distortion measurement value to the threshold distortion range.

13. The method of claim 10, wherein:
the first measurement value indicates a zero-crossing measurement value, and the threshold level includes a threshold distortion range corresponding to an expected level of distortion associated with the normal operating condition;

the method further comprising determining that the zero-crossing measurement value exceeds a threshold level associated with an expected quantity of measurements that indicate the zero-crossing measurement value, wherein the determining that the operating condition within the first utility box includes the existing arcing condition is further based on the determining that the zero-crossing measurement value exceeds the threshold level.

14. The method of claim 10, further comprising:
determining, based on the first measurement value, a frequency spectrum of the utility electrical signal transmitted to the first electrical meter,
determining, an amplitude of a particular frequency included in the frequency spectrum, and
determining that the particular frequency is outside of a harmonic range of a fundamental frequency of the utility electrical signal transmitted to the first electrical meter,
wherein the comparing the first measurement value to the threshold level includes comparing the amplitude of the particular frequency to a threshold amplitude range corresponding to an expected amplitude range associated with frequencies outside the harmonic range.

15. The method of claim 10, wherein:
the first measurement value includes the ion level within the first utility box, the ion level indicating a level of ions detected by an ion detector included in the first electrical meter,
the threshold level includes a threshold ion level range corresponding to an expected ion level range associated with the normal operating condition and
the determining that the operating condition within the first utility box includes the existing arcing condition is further based on a comparison of the ion level to the threshold ion level range.

16. A system to detect electrical arcing between an electrical meter and a meter socket in a utility box, the system comprising:
the electrical meter configured to transmit utility electrical signals from a utility side of the meter socket to a premises side of the meter socket, the electrical meter having a disconnect circuit capable of interrupting the transmission of the utility electrical signals;
an ion detector capable of indicating a level of ions present in the utility box; and
a processor capable of communicating with the ion detector and the disconnect circuit;
wherein the processor is capable of:
receiving the indicated level of ions,
comparing the indicated level of ions to a threshold ion level,
determining, based on the indicated level of ions being within a first range from the threshold ion level, that a potential arcing condition is present,
in response to determining that the potential arcing condition is present, providing an indication of the potential arcing condition to a communication subsystem and instructing the communication subsystem to transmit the indication of the potential arcing condition to a central system,
determining, based on the indicated level of ions being within a second range from the threshold ion level, that an existing arcing condition is present, and
in response to determining that the existing arcing condition is present, providing a disconnect signal to the disconnect circuit.

17. The system of claim 16, wherein the processor is further capable of providing, in response to determining that the existing arcing condition is present, an indication of the existing arcing condition to the communication subsystem, and instructing the communication subsystem to transmit the indication to a central system.

18. The system of claim 16, wherein providing the disconnect signal to the disconnect circuit is further responsive to receiving an instruction signal from a remote device.

19. The system of claim 16, wherein the processor is further capable of:
receiving a measurement describing one or more of a voltage level of the utility electrical signals or a current level of the utility electrical signals,
wherein determining that the existing arcing condition is present is further based on a second comparison of the received measurement to a second threshold level.

20. The system of claim 16, wherein:
the electrical meter further includes the ion detector, the processor, and a memory capable of storing one or more measurement values describing the indicated level of ions,
the processor is further capable of, based on the stored measurement values, determining a learned pattern indicating a normal operating condition of the utility box, and
the threshold ion level is based on the learned pattern.

* * * * *